(12) United States Patent
Su et al.

(10) Patent No.: US 8,420,477 B2
(45) Date of Patent: Apr. 16, 2013

(54) METHOD FOR FABRICATING A GATE DIELECTRIC LAYER AND FOR FABRICATING A GATE STRUCTURE

(75) Inventors: Kuo Hui Su, Taipei (TW); Yi Nan Chen, Taipei (TW); Hsien Wen Liu, Luzhu Township (TW)

(73) Assignee: Nanya Technology Corporation, Kueishan, Tao-Yuan Hsien (TW)

( * ) Notice: Subject to any disclaimer, the term of this patent is extended or adjusted under 35 U.S.C. 154(b) by 194 days.

(21) Appl. No.: 13/095,291

(22) Filed: Apr. 27, 2011

(65) Prior Publication Data

US 2012/0276731 A1    Nov. 1, 2012

(51) Int. Cl.
*H01L 21/8238*    (2006.01)

(52) U.S. Cl.
USPC ............ 438/216; 438/287; 438/591; 438/791

(58) Field of Classification Search .................. 438/216, 438/287, 591, 778, 786, 791; 257/E21.191, 257/E21.625, E21.639
See application file for complete search history.

(56) References Cited

U.S. PATENT DOCUMENTS

2010/0184281 A1*    7/2010    Hsu et al. ...................... 438/591

* cited by examiner

*Primary Examiner* — Thanhha Pham
(74) *Attorney, Agent, or Firm* — Novak Druce Connolly Bove + Quigg LLP

(57) ABSTRACT

A method for fabricating a gate dielectric layer comprises the steps of: forming a dielectric layer on a semiconductor substrate; performing a nitrogen treating process to form a nitride layer on the dielectric layer; and performing a thermal treating process at 1150-1400° C. for a period of 400-800 milliseconds, to form a gate dielectric layer. A step of forming a gate layer on the gate dielectric layer may be performed to form a gate structure.

19 Claims, 8 Drawing Sheets

METHOD FOR FABRICATING A GATE DIELECTRIC LAYER AND FOR FABRICATING A GATE STRUCTURE

TECHNICAL FIELD

The present invention relates to methods for fabricating a semiconductor structure, and more particularly, to methods for fabricating a gate dielectric layer and for fabricating a gate structure.

BACKGROUND

Advances in semiconductor technology have been accompanied by continuous improvement in miniaturization of semiconductor components such as MOS transistors, leading to increasingly stringent standards for gate oxide thickness and quality. A key objective for semiconductor manufacturers in this regard is the development of ultra-thin gate dielectric layer that is high in quality, reliability, durability, and that offers high voltage and resistance.

Dynamic random access memory (DRAM) is an illustrative example of a key integrated circuit enjoying rapid advancement through persistent research and development. A DRAM cell generally includes a transistor and a capacitor controlled by the transistor, and the transistor includes at least one gate structure having a gate dielectric layer such as a silicon oxide layer.

An undesired side effect of component miniaturization has resulted from thinning of the gate dielectric layer, which has led to leakage and reduced reliability.

A traditional method of reducing leakage is to increase the thickness of the gate dielectric layer, or to implant nitrogen into the gate dielectric layer to increase the dielectric constant (K). For example, for a silicon oxide layer having a dielectric constant of 4, a nitrogen-implanted silicon oxide layer can increase the dielectric constant to 8.

A traditional soak rapid thermal process (RTP) is performed at 400-1150° C. for about 20 seconds to stabilize the nitrogen in the gate dielectric layer. However, nitrogen can diffuse into the gate dielectric layer after the "long-term" rapid thermal process. Besides, other "long-term" rapid thermal processes, such as for forming gate layer and source/drain, will further increase the diffusion of nitrogen. The conventional rapid thermal processes can degrade the capacitive effective thickness (CET) and reduce reliability.

Therefore, there is need for methods of fabricating a gate dielectric layer and fabricating a gate structure.

SUMMARY

One aspect of the present invention provides a method for fabricating a gate dielectric layer to reduce the CET and mitigate the CET degradation after thermal treating process. In one embodiment of the present invention, a method for fabricating a gate dielectric layer comprises the steps of: forming a dielectric layer on a semiconductor substrate; performing a nitrogen treating process to form a nitride layer on the dielectric layer; and performing a thermal treating process at 1150-1400° C. for a period of 400-800 milliseconds, to form a gate dielectric layer.

Another aspect of the present invention provides a method for fabricating a gate structure to reduce the CET and mitigate the CET degradation after thermal treating process. In one embodiment of the present invention, a method for fabricating a gate structure comprises the steps of: forming a dielectric layer on a semiconductor substrate; performing a nitrogen treating process to form a nitride layer on the dielectric layer; performing a thermal treating process at 1150-1400° C. for a period of 400-800 milliseconds, to form a gate dielectric layer; and forming a gate layer on the gate dielectric layer.

The foregoing outlines rather broadly the features of the present invention in order that the detailed description of the invention to follow may be better understood. Additional features of the invention will be described hereinafter and form the subject of the claims of the invention. It should be appreciated by those skilled in the art that the concept and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 1:
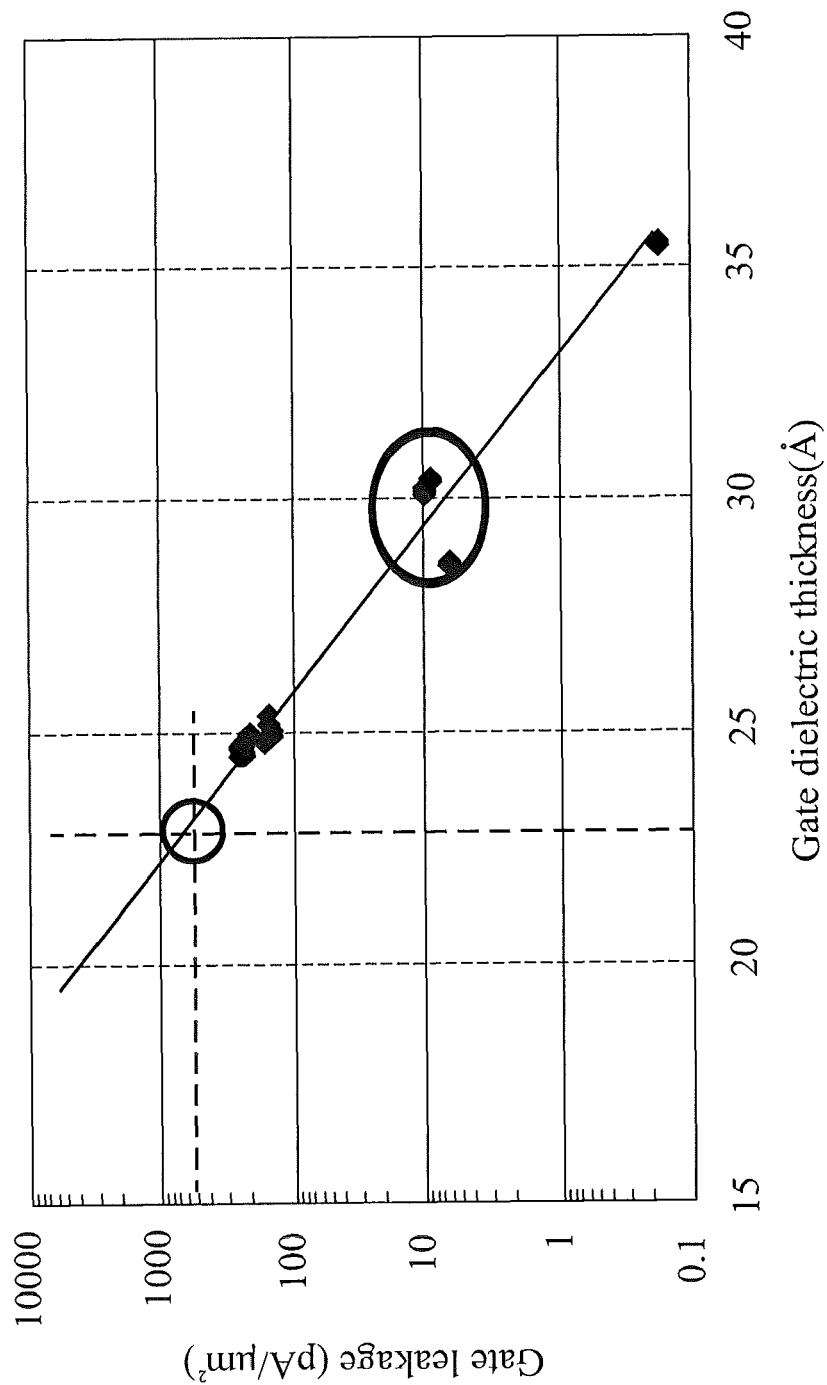
FIG. 1 is a chart illustrating the profile of the gate dielectric thickness and the leakage of a transistor.

FIG. 1 is a chart illustrating the profile of the gate dielectric thickness and the gate leakage of a transistor. The profile shows that gate leakage is inversely exponentially proportional to gate dielectric thickness. As shown in FIG. 1, the gate leakage at thickness of 30 angstrom (Å) is about 10 pA/$\mu m^2$. However, the gate leakage at thickness of 23 Å rapidly increases to 600 pA/$\mu m^2$.

The present invention provides methods for fabricating a gate dielectric layer and for fabricating a gate structure, so as to reduce CET as well as the gate leakage and increase reliability of components.

Figure 2:
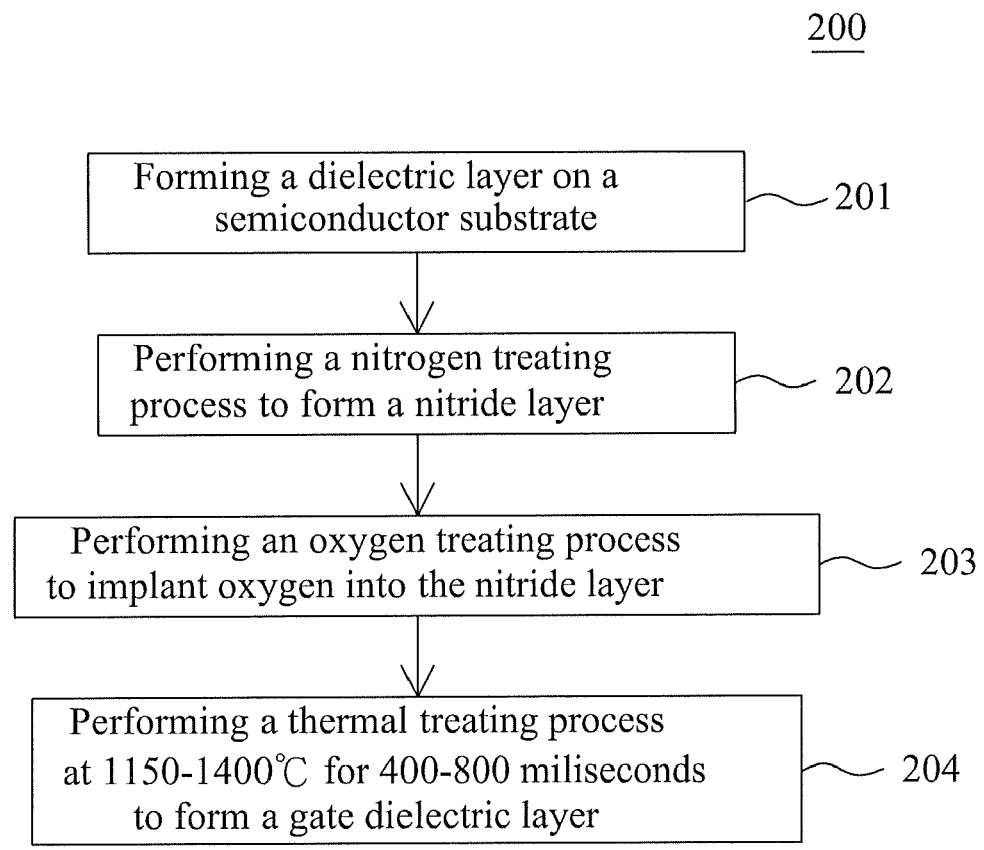
FIG. 2 is a flow diagram illustrating a method for fabricating a gate dielectric layer according to one embodiment of the present invention.

FIG. 2 is a flow diagram illustrating a method 200 for fabricating a gate dielectric layer according to one embodiment of the present invention. FIG. 3 to FIG. 6 illustrate a method for fabricating a gate dielectric layer according to one embodiment of the present invention.

Figure 3:
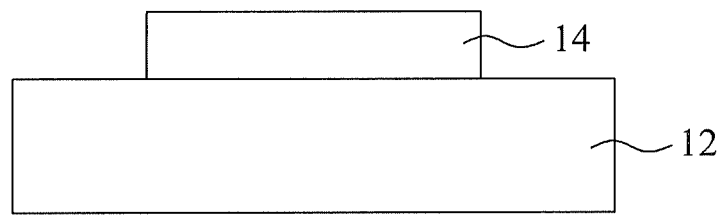
FIG. 3 to FIG. 6 illustrate a method for fabricating a gate dielectric layer according to one embodiment of the present invention.

As shown in step 201 and FIG. 3, in one embodiment of the present invention, a semiconductor substrate 12 such as a silicon substrate is provided. In practice, the semiconductor substrate 12 may be a P-type or N-type semiconductor substrate. A dielectric layer 14 is then formed on the semiconductor substrate 12. In one embodiment of the present invention, the material of the dielectric layer 14 may be silicon oxide, for example.

Figure 4:
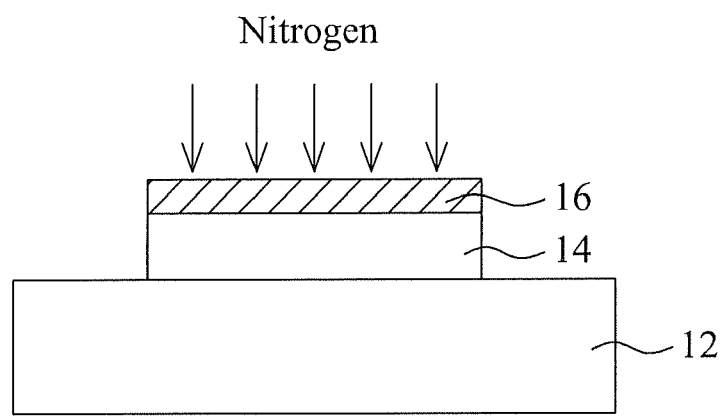

As shown in step 202 and FIG. 4, a nitrogen treating process, such as nitrogen plasma incorporation, is performed to form a nitride layer 16 on the dielectric layer 14. The nitrogen treating process may be decoupling plasma nitridation or soft plasma annealing, but is not limited thereto.

Figure 5:
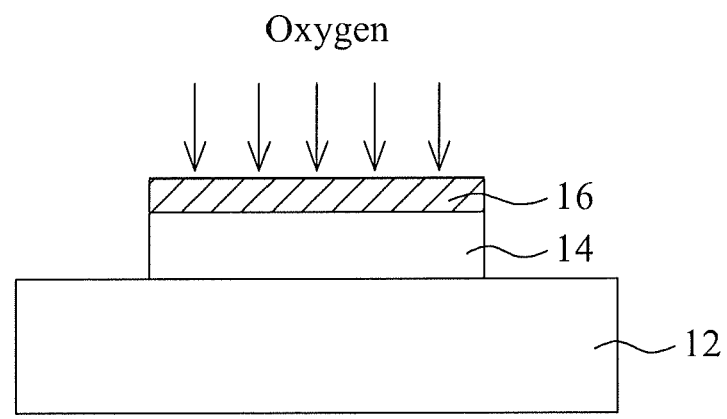

As shown in step 203 and FIG. 5, optionally, an oxygen treating process is performed to implant oxygen into the nitride layer 16 after the nitrogen treating process. In one embodiment of the present invention, the dielectric layer 14 is a silicon oxide layer and the nitride layer 16 is a silicon nitride layer, and the oxygen is implanted into the nitride layer 16 to form silicon-oxy-nitride (SiON).

The implanted oxygen can trap and stabilize the nitrogen in the nitride layer 16, so as to prevent nitrogen diffusion in the semiconductor substrate 12 and fix the defects at the interface of the nitride layer 16 and the dielectric layer 14, thereby reducing gate leakage and increasing reliability of components even when the CET is very small.

Figure 6:
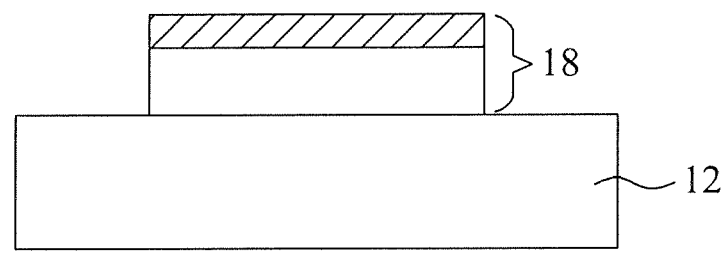

As shown in step 204 and FIG. 6, a thermal treating process is performed at 1150-1400° C., preferably at 1250-1300° C., for a period of 400-800 milliseconds, to form a gate dielectric layer 18 on the semiconductor substrate 12. The thermal treating process may be rapid thermal annealing. It is noted that any treating process which can be performed to rearrange the grain structure and eliminate internal stress would be suitable for forming the gate dielectric layer 18.

As the method 200 for fabricating a gate dielectric layer of the present invention is performed at a higher temperature of 1150-1400° C. for a period of 400-800 milliseconds, not only can the nitrogen in the gate dielectric layer 18 be stabilized but also the nitrogen diffusion into the gate dielectric layer 18 can be prevented after the "short-term" rapid treating process.

It is noted that the "short-term" thermal treating process can be used in other thermal treating processes, such as for forming gate layer and source/drain. The "short-term" thermal treating process can reduce the capacitive effective thickness, the nitrogen diffusion and the CET degradation after the other thermal treating processes, thereby increasing reliability of components.

Figure 7:
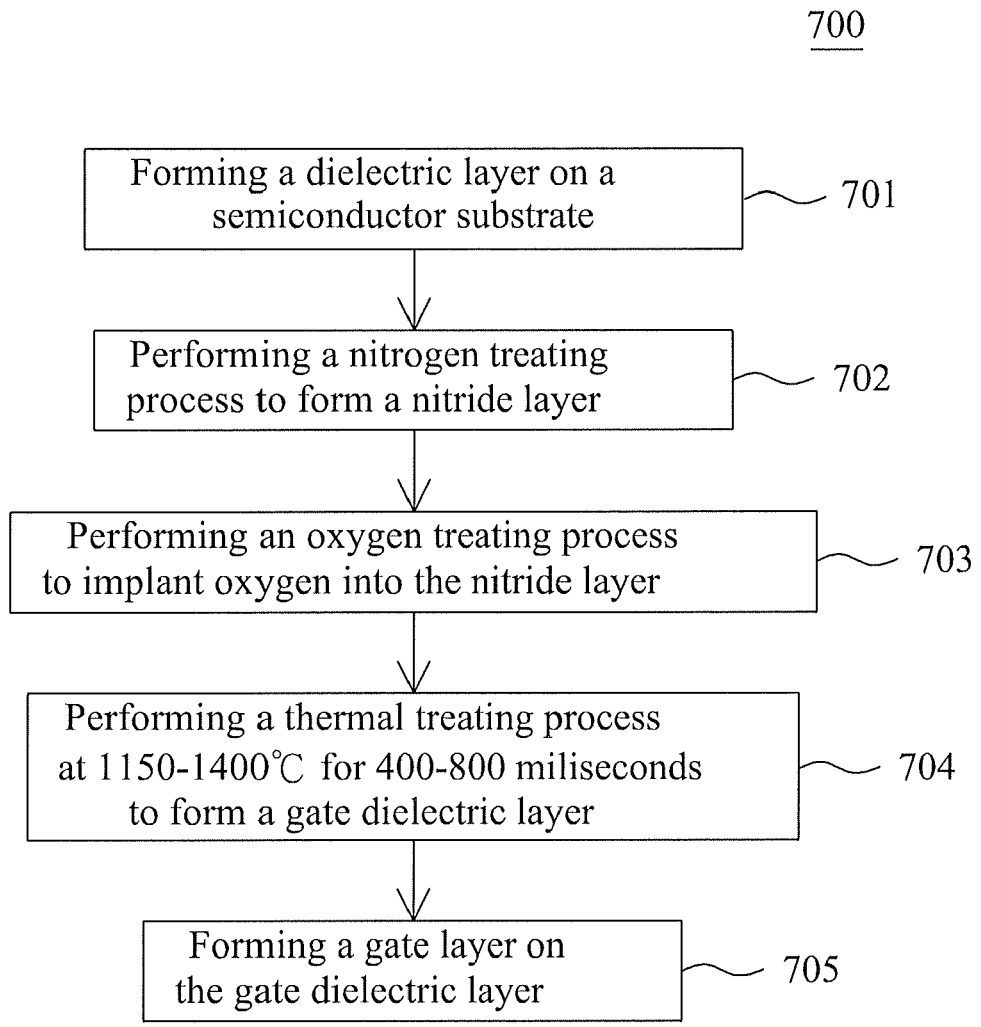
FIG. 7 is a flow diagram illustrating a method for fabricating a gate structure according to one embodiment of the present invention.

FIG. 7 is a flow diagram illustrating a method 700 for fabricating a gate structure according to one embodiment of the present invention. FIG. 8 to FIG. 12 illustrate a method for fabricating a gate structure according to one embodiment of the present invention.

Figure 8:
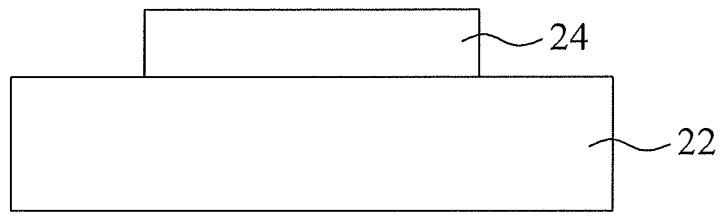
FIG. 8 to FIG. 13 illustrate a method for fabricating a gate structure according to one embodiment of the present invention.

As shown in step 701 and FIG. 8, in one embodiment of the present invention, a semiconductor substrate 22 such as a silicon substrate is provided. In practice, the semiconductor substrate 22 may be a P-type or N-type semiconductor substrate. A dielectric layer 24 is then formed on the semiconductor substrate 22. In one embodiment of the present invention, the material of the dielectric layer 24 may be silicon oxide, for example.

Figure 9:
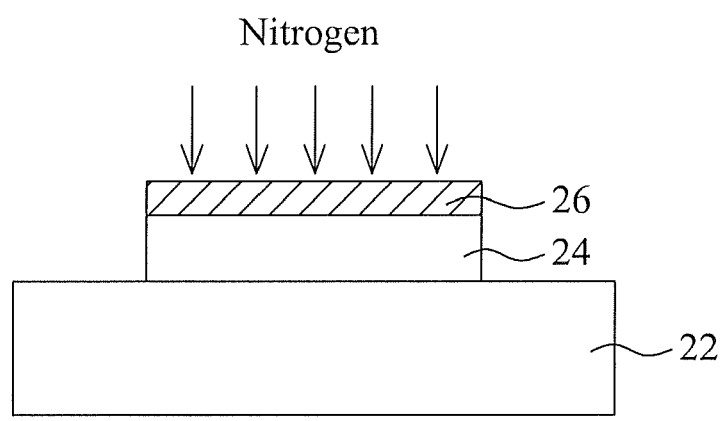

As shown in step 702 and FIG. 9, a nitrogen treating process such as nitrogen plasma incorporation is performed to form a nitride layer 26 on the dielectric layer 24. The nitrogen treating process may be decoupling plasma nitridation or soft plasma annealing, but is not limited thereto.

Figure 10:
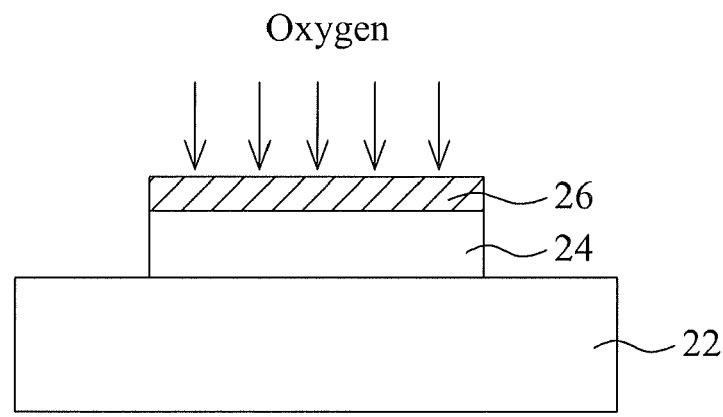

As shown in step 703 and FIG. 10, optionally, an oxygen treating process may be performed to implant oxygen into the nitride layer 26 after the nitrogen treating process. In one embodiment of the present invention, the dielectric layer 24 is a silicon oxide layer, the nitride layer 26 is a silicon nitride layer, and oxygen is implanted into the nitride layer 26 to form silicon-oxy-nitride (SiON).

The implanted oxygen can trap and stabilize the nitrogen in the nitride layer, so as to prevent nitrogen diffusion in the semiconductor substrate 22 and fix the defects at the interface of the nitride layer 26 and the dielectric layer 24, thereby reducing gate leakage and increasing reliability of components even when the CET is very small.

Figure 11:
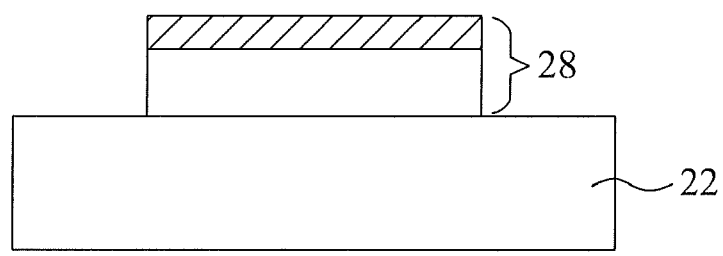

As shown in step 704 and FIG. 11, a thermal treating process is performed at 1150-1400° C., preferably at 1250-1300° C., for a period of 400-800 milliseconds, to form a gate dielectric layer 28. The thermal treating process may be rapid thermal annealing. It is noted that any treating process which can be performed to rearrange the grain structure and eliminate internal stress would be suitable for forming the gate dielectric layer 28.

As the method 700 for fabricating a gate dielectric layer of the present invention is performed at a higher temperature of 1150-1400° C. for a period of 400-800 milliseconds, not only can the nitrogen in the gate dielectric layer 18 be stabilized but also the nitrogen diffusion into the gate dielectric layer 18 can be prevented after the "short-term" rapid treating process.

It is noted that the "short-term" thermal treating process can be used in other thermal treating processes, such as for forming gate layer or source/drain. The "short-term" thermal treating process can reduce capacitive effective thickness (CET), nitrogen diffusion and CET degradation after the other thermal treating processes, thereby increasing reliability of components.

Figure 12:
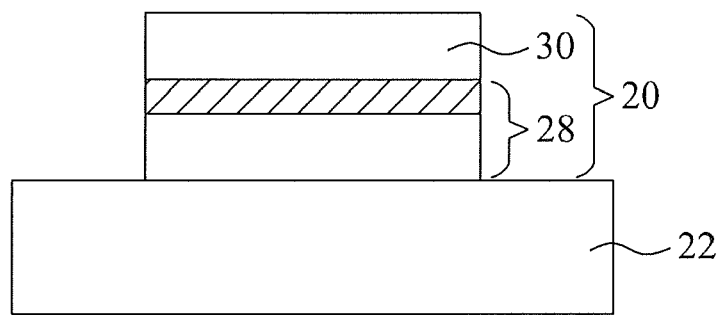

As shown in step 705 and FIG. 12, a gate layer 30 is formed on the gate dielectric layer 28, to form a gate structure 20 on the semiconductor substrate 22. In one embodiment of the present invention, the forming process of the gate layer 30 further comprises the steps of forming a polysilicon layer on the gate dielectric layer 28 and implanting boron into the polysilicon layer to form the gate layer 30, in fabricating a PMOS, for example. The material of the gate layer 30 may be, for example, a doped polysilicon layer, or a combination of a doped polysilicon layer and a metal silicide layer, wherein the metal silicide layer may be a tungsten silicide layer.

It is noted that in addition to preventing nitrogen diffusion and fixing interface defects, the implanted oxygen can further barricade against boron diffusing into the gate dielectric layer 28.

Figure 13:
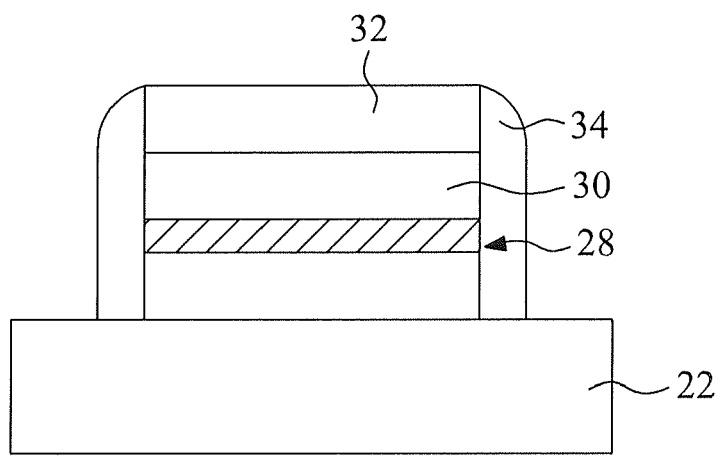

As shown in FIG. 13, a cap layer 32 may be disposed on the gate layer 16 according to actual requirements, and the material thereof may be silicon oxide, for example, silicon nitride or other suitable insulated materials. According to actual requirements, a spacer 34 may be disposed on sidewalls of the gate structure 20, and the material thereof may be, for example, silicon oxide, silicon nitride or other suitable insulated materials.

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a gate dielectric layer, comprising the steps of:
   forming a dielectric layer on a semiconductor substrate;
   performing a nitrogen treating process to form a nitride layer on the dielectric layer; and
   performing a thermal treating process substantially at 1150-1400° C. for a period of 400-800 milliseconds, to form a gate dielectric layer.

2. The method for fabricating a gate dielectric layer of claim 1, wherein the dielectric layer is formed on a silicon substrate.

3. The method for fabricating a gate dielectric layer of claim 1, wherein the nitrogen treating process includes nitrogen plasma incorporation.

4. The method for fabricating a gate dielectric layer of claim 3, wherein the nitrogen plasma incorporation includes decoupling plasma nitridation or soft plasma annealing.

5. The method for fabricating a gate dielectric layer of claim 1, further comprising a step of performing an oxygen treating process to implant oxygen into the nitride layer after the nitrogen treating process.

6. The method for fabricating a gate dielectric layer of claim 5, wherein the dielectric layer is a silicon oxide layer, the nitride layer is a silicon nitride layer, and oxygen is implanted into the nitride layer to form silicon-oxy-nitride (SiON).

7. The method for fabricating a gate dielectric layer of claim 1, wherein the thermal treating process is a rapid thermal annealing.

8. The method for fabricating a gate dielectric layer of claim 1, wherein the thermal treating process is performed substantially at 1250-1300° C.

9. A method for fabricating a gate structure, comprising the steps of:
   forming a dielectric layer on a semiconductor substrate;
   performing a nitrogen treating process to form a nitride layer on the dielectric layer;
   performing a thermal treating process substantially at 1150-1400° C. for a period of 400-800 milliseconds, to form a gate dielectric layer; and
   forming a gate layer on the gate dielectric layer.

10. The method for fabricating a gate structure of claim 9, wherein the dielectric layer is formed on a silicon substrate.

11. The method for fabricating a gate structure of claim 10, wherein the thermal treating process is performed substantially at 1250-1300° C.

12. The method for fabricating a gate structure of claim 9, wherein the nitrogen treating process includes nitrogen plasma incorporation.

13. The method for fabricating a gate structure of claim 12, wherein the nitrogen plasma incorporation includes decoupling plasma nitridation or soft plasma annealing.

14. The method for fabricating a gate structure of claim 9, further comprising a step of performing an oxygen treating process to implant oxygen into the nitride layer after the nitrogen treating process.

15. The method for fabricating a gate structure of claim 14, wherein the dielectric layer is a silicon oxide layer, the nitride layer is a silicon nitride layer, and oxygen is implanted into the nitride layer to form silicon-oxy-nitride (SiON).

16. The method for fabricating a gate structure of claim 9, wherein the thermal treating process is rapid thermal annealing.

17. The method for fabricating a gate structure of claim 9, further comprising a step of forming a cap layer on the gate layer.

18. The method for fabricating a gate structure of claim 9, wherein the forming process of the gate layer further comprises the steps of:
   forming a polysilicon layer on the gate dielectric layer; and
   implanting boron into the polysilicon layer to form the gate layer.

19. he method for fabricating a gate structure of claim 9, further comprising a step of forming a spacer on sidewalls of the gate structure.

* * * * *